(12) United States Patent
Nakanishi et al.

(10) Patent No.: US 7,495,346 B2
(45) Date of Patent: Feb. 24, 2009

(54) SEMICONDUCTOR PACKAGE

(75) Inventors: Tohru Nakanishi, Shigaken (JP); Kosei Tanahashi, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/184,641

(22) Filed: Aug. 1, 2008

(65) Prior Publication Data

US 2008/0290501 A1 Nov. 27, 2008

Related U.S. Application Data

(63) Continuation of application No. 11/851,169, filed on Sep. 6, 2007.

(30) Foreign Application Priority Data

Dec. 13, 2006 (JP) ............... 2006-336256

(51) Int. Cl.
  *H01L 23/28* (2006.01)
  *H01L 23/10* (2006.01)

(52) U.S. Cl. ............... 257/796; 257/706; 257/787; 257/712; 257/E23.135

(58) Field of Classification Search ............... 257/796, 257/706, 712, 787, E23.135
See application file for complete search history.

(56) References Cited

U.S. PATENT DOCUMENTS 5,485,037 A * 1/1996 Marrs ............... 257/712

| 6,020,221 | A | 2/2000 | Lim et al. |
| 6,432,749 | B1 | 8/2002 | Libres |
| 2001/0042863 | A1* | 11/2001 | Yamada et al. ............... 257/78 |
| 2004/0036183 | A1* | 2/2004 | Im et al. ............... 257/796 |
| 2004/0150118 | A1 | 8/2004 | Honda |
| 2006/0249852 | A1 | 11/2006 | Chiu et al. |
| 2007/0128889 | A1 | 6/2007 | Goto et al. |
| 2007/0296079 | A1 | 12/2007 | Huang et al. |

FOREIGN PATENT DOCUMENTS

| JP | 2003092376 | 3/2003 |
| JP | 2004260138 | 9/2004 |

OTHER PUBLICATIONS

Notice of Allowance dated Dec. 28, 2008 re: U.S. Appl. No. 12/184,555.

* cited by examiner

*Primary Examiner*—Nitin Parekh
(74) *Attorney, Agent, or Firm*—Shimokaji & Associates, P.C.

(57) ABSTRACT

There is provided a semiconductor package including: a substrate having a plurality of electrode pads on a surface thereof; a semiconductor chip mounted on the substrate, the semiconductor chip electrically connecting with the plurality of electrode pads; and a stiffener arranged on the substrate so as to surround the semiconductor chip. The stiffener includes: an insulating material layer; and a rigid plate mounted substantially parallel to a surface of the substrate in the insulating material layer, the rigid plate having formed therein a plurality of through holes, at least a part of the through holes being filled with the insulating material.

12 Claims, 4 Drawing Sheets

SEMICONDUCTOR PACKAGE

FIELD OF THE INVENTION

The present invention relates to a semiconductor package. More particularly, the present invention relates to a semiconductor package having large thermal stress resistance.

BACKGROUND OF THE INVENTION

In recent years, as a substrate for use in a semiconductor package, there has been increasingly used what is called a coreless substrate, which contains no core made of relatively rigid glass epoxy. The coreless substrate includes a build-up substrate (SLC substrate) composed of an insulating layer and patterned conductor layer alternately stacked. A package obtained by mounting a semiconductor chip on the coreless substrate is generally called a coreless package.

FIG. 1 is a cross-sectional view of a conventional coreless package. On a coreless substrate 1, there is mounted a semiconductor chip 3 which electrically connects with an electrode pad (not illustrated) on the surface of the substrate. The space between the surface of the substrate 1 and the semiconductor chip 3 is filled with an underfill 5 made of a resin material. A stiffener 7 made of a resin material is arranged around the semiconductor chip 3 on the substrate 1. The coreless substrate 1, having no rigid core, is lower in stiffness than a substrate with core. The resin stiffener 7 is provided for the purpose of compensating for such low stiffness of the substrate. Referring to FIG. 1, there is further illustrated a ball grid (BGA) 9 for electrically connecting the substrate 1 to another substrate (not illustrated).

In the conventional coreless package of FIG. 1, the effect of resin stiffener is insufficient. Consequently, from the difference of thermal expansion coefficient between the substrate, the semiconductor chip, the underfill and the stiffener, thermal stress is caused by thermal fluctuations in the solder reflow process or the like. The thermal stress may cause defects such as warpage of the entire substrate, occurrence of cracks and fissures in the semiconductor chip, or peeling off of the semiconductor chip from the substrate.

In order to prevent the occurrence of the defects, there is a technique of adding a filler to the resin constituting the stiffener to raise the stiffness of stiffener, or a technique of bringing, by resin component adjustment, the thermal expansion coefficient of stiffener close to the thermal expansion coefficient of silicon constituting the semiconductor chip. However, these conventional techniques are insufficient to supplement the stiffness of substrate to thereby reduce thermal stress.

As another technique, Japanese Published Unexamined Patent Application No. 2003-92376, has disclosed that, in order to increase the mechanical strength of resin stiffener, a reinforcement material (plate) made of iron is buried in the resin stiffener. However, in the technique of this publication, peeling-off may occur in the interface between the resin and reinforcement material (plate) and thus the effect of supplementing the stiffness of substrate to reduce thermal stress may not be achieved. Also, in the technique of this publication, positioning operation for properly arranging a plurality of reinforcement materials (metal pieces) in the resin is needed, thus making the manufacturing process complex.

SUMMARY OF THE INVENTION

An aspect of the present invention is to provide a semiconductor package that is strong against thermal stress.

Another aspect of the present invention is to provide a semiconductor package having excellent thermal stress resistance and heat radiation characteristics.

Another aspect of the present invention is to provide a semiconductor package capable of reducing effects of substrate warpage or the like caused by thermal fluctuations.

Another aspect of the present invention is to provide a semiconductor package capable of improving the stiffness of a coreless substrate.

According to the present invention, there is provided a semiconductor package comprising: a substrate having a plurality of electrode pads on a surface thereof; a semiconductor chip mounted on the substrate, the semiconductor chip electrically connecting with the plurality of electrode pads; and a stiffener arranged on the substrate so as to surround the semiconductor chip, wherein the stiffener comprises an insulating material layer; and a rigid plate mounted substantially parallel to a surface of the substrate in the insulating material layer, the rigid plate having formed therein a plurality of through holes, at least a part of the through holes being filled with the insulating material.

BRIEF DESCRIPTION OF THE DRAWINGS

These and other features of this invention will be more readily understood from the following detailed description of the various aspects of the invention taken in conjunction with the accompanying drawings.

Figure 1:
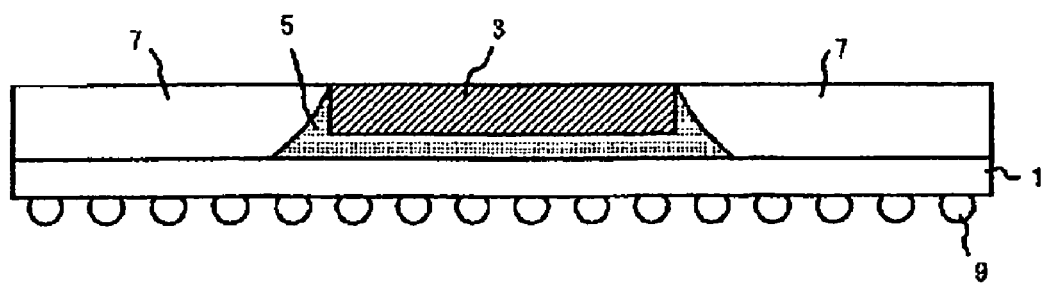
FIG. 1 is a cross-sectional view of a conventional coreless package.

The drawings are merely schematic representations, not intended to portray specific parameters of the disclosure. The drawings are intended to depict only typical embodiments of the disclosure, and therefore should not be considered as limiting the scope of the disclosure. In the drawings, like numbers represent like elements.

DETAILED DESCRIPTION OF THE INVENTION

Figure 2:
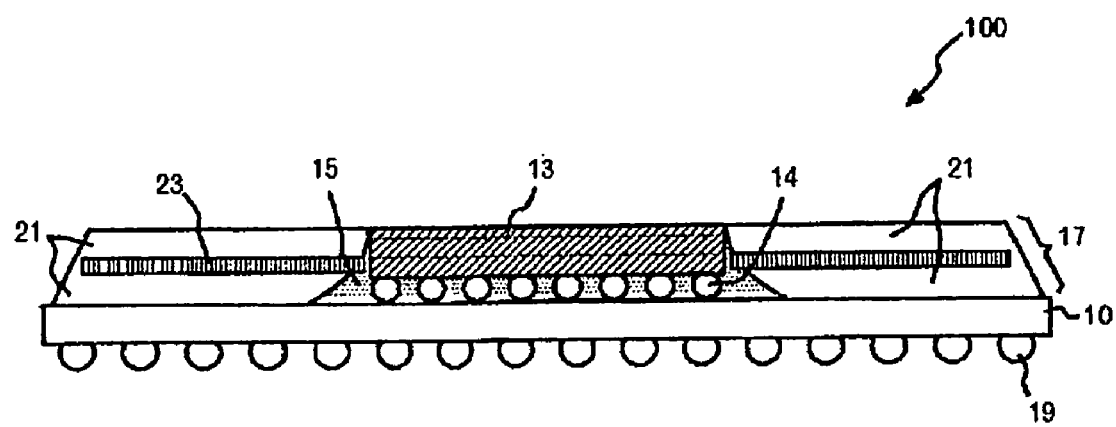
FIG. 2 is a cross-sectional view of a semiconductor package according to an embodiment of the present invention.

The present invention will be described in detail below with reference to the drawings. FIG. 2 is a cross-sectional view of a semiconductor package 100. On a coreless substrate 10, there is mounted a semiconductor chip 13 electrically connecting via a soldering ball 15 with an electrode pad (not illustrated) on a surface of the substrate. The semiconductor chip 13 includes all types of semiconductor chips: a microprocessor unit (MPU), an LSI chip such as a system-on-chip (SoC), a memory chip, and the like. The type of semiconductor is not limited to silicon (Si) and includes chemical compounds such as GaAs and InP. A chip composed of plural types of semiconductors, such as GaAs/Si, is also possible. The space between the surface of the substrate 10 and the semiconductor chip 13 is filled with an underfill 15 made of a resin material. The underfill 15 is used to reinforce the junction between the semiconductor chip 13 and substrate 10. As the material of the underfill 15, thermoset epoxy resin is used, for example.

A stiffener 17 is arranged so as to surround the semiconductor chip 13 on the substrate 10. The coreless substrate 10, having no rigid core, is lower in stiffness than a substrate with core. As the coreless substrate, a build-up wiring substrate composed of an insulating layer and wiring layer alternately stacked, for example. The stiffener 17 is provided for the purpose of compensating for such low stiffness of the substrate. Referring to FIG. 2, there is also illustrated a ball grid allay (BGA) 19 for electrically connecting the substrate 1 to another base substrate (not illustrated).

Figure 3:
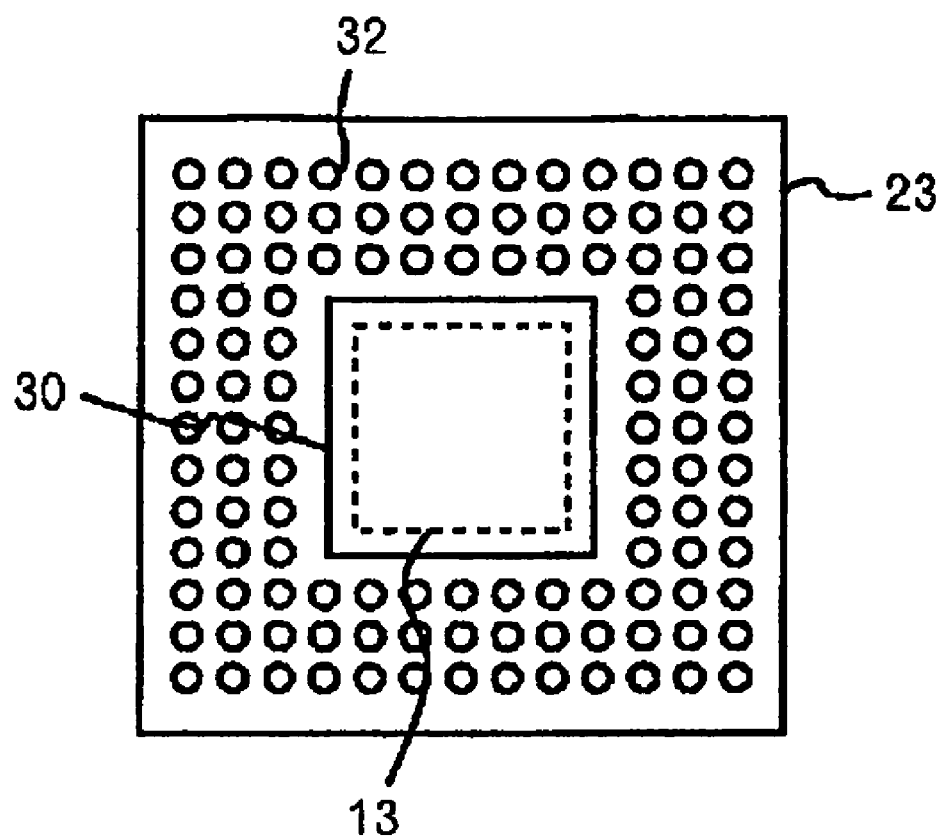
FIG. 3 is an upper face view of a rigid plate before placement on a substrate.

The stiffener 17 includes an insulating material layer 21 and a rigid plate 23 mounted in the insulating material layer 21. As the insulating material, there is a resin material, for example. The rigid plate 23 serves particularly to compensate for the low stiffness of the substrate. FIG. 3 is an upper face view of the rigid plate 23 before placement on the substrate 10. The rigid plate 23 has an opening 30 slightly larger than the size (broken line 13 of FIG. 3) of the semiconductor chip 13. The rigid plate 23 has a plurality of through holes 32 spaced equally and arranged uniformly in a grid pattern. The through holes don't necessarily need to be arranged in a grid pattern; it is sufficient that at least a plurality of through holes are arranged in a scattered manner (apart from each other) on the surface of the rigid plate 23. The diameter of the through holes 32 can be arbitrarily determined. However, the diameter of the through holes 32 must be large enough to allow an insulating material such as resin to enter (fill) at least a part of the through holes when the rigid plate 23 is mounted on the substrate 10. Since at least a part, or all of the through holes are filled with an insulating material such as resin, the adhesion between the rigid plate 23 and the insulating material surrounding the rigid plate 23 is improved.

The rigid plate 23 is composed of metal such as copper, or metal alloy, for example. A substance having a high thermal conductivity and a high strength and being excellent in flatness and surface processability is preferably used for the rigid plate 23. The high thermal conductivity allows heat radiated from the semiconductor chip 13 to be transmitted and discharged to the outside of the package. The high strength and flatness allow high tolerance against deformation caused by thermal stress. The excellence in surface processability allows easy formation of the opening 30 and through hole 32. Press processing, drill processing, semiconductor photolithography (etching), or the like is used for formation of the through hole 32. Referring to FIG. 2, there is the underfill 15 between the rigid plate 23 and semiconductor chip 13. When the end of the rigid plate 23 is thermally connected to at least a part of the side face of the semiconductor chip 13, the thermal conduction effect (particularly in a horizontal direction) of heat radiation from the semiconductor chip 13 can be improved. The expression "thermal connection" used herein means both direct connection and connection via a thermally conductive substance.

The manufacturing method of the semiconductor package according to the present invention will be described with reference to FIG. 4. In step (a), a substrate 10 having a plurality of electrode pads on a surface thereof is prepared. On the surface of the substrate 10, there is also a patterned wiring connecting with the plurality of electrode pads. In step (b), a semiconductor chip 13 is mounted and electrically connected to the plurality of electrode pads on the surface of the substrate 10. In step (b), using a soldering ball 14, the semiconductor chip 13 and the plurality of electrode pads are joined (flip chip junction). In step (c), an underfill is injected between the surface of the substrate 10 and the semiconductor chip 13. As the underfill, thermoset epoxy resin is injected by use of a dispenser. After the injection, the entire substrate is heated to harden the epoxy resin. The underfill is also attached to the side face 36 of the semiconductor chip 13. However, in a case where, in a step of mounting a rigid plate 23 (subsequent step (e)), the rigid plate 23 is joined directly or via conductive adhesive to the side face 36 of the semiconductor chip 13, the underfill is attached only to the lower section of the side face 36 of the semiconductor chip 13. The expression "lower section" used herein means an at least lower side than the junction point between the rigid plate 23 and the side face 36 of the semiconductor chip 13.

In step (d), a first insulating material layer 26 is arranged around the semiconductor chip 13 on the substrate 10. As the first insulating material layer 26, resin is attached to the surface of the substrate 10. As this resin, sealing resin such as epoxy resin can be used. Of hardening type, any of thermoset type and light cure type can be used. In step (e), a rigid plate 23 prepared separately in advance is mounted on the first insulating material layer 26. The rigid plate 23 is as described above, composed of a metal plate and the like having a plurality of through holes. In preparing the rigid plate 23, when holes are formed in the rigid plate 23 made of a metal plate by a press processing, a protrusion used for positioning is preferably simultaneously formed.

Figure 5:
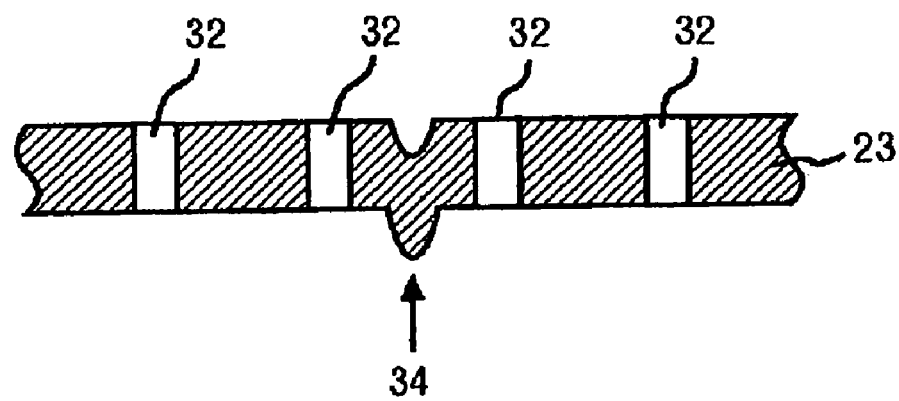
FIG. 5 is a partially enlarged cross-sectional view of the rigid plate.

FIG. 5 illustrates an example of protrusion 34 used for positioning; FIG. 5 is a cross-sectional view of a part of the rigid plate containing the protrusion 34. The protrusion 34 is formed by pressing the metal between the through holes 32. In this case, the through holes 32 and the protrusion 34 can be simultaneously formed. In step (e), the rigid plate 23 is mounted on the first insulating material layer 26 so that the protrusion 34 used for positioning agrees with a positioning mark (not illustrated) preliminarily formed on the surface of the substrate 10. In this case, as the first insulating material layer 26, there must be used a material which is transparent or allows at least the substrate surface to show. The positioning mark on the surface of the substrate 10 can be formed simultaneously with the formation of the wiring pattern (electrode pad) of the surface of the substrate 10.

In step (f), a second insulating material layer 28 is arranged on the first insulating material layer 26 so as to surround the rigid plate 23. For the second insulating material layer 28, the same material as the first insulating material layer 26, or a material of a different type can be used. However, the second insulating material layer 28 must have a thermal expansion coefficient close to that of the first insulating material layer 26. Further, the second insulating material layer 28 must be made of a material such as resin of a viscosity which is low to a certain degree. In step (f), at least a part of the plurality of through holes 32 of the rigid plate 23 are filled with the insulating material. Ideally, the filling is performed in all the through holes 32; but, not all of them need to be filled. Thereafter, the entire substrate is heated, or light is irradiated on the upper face of the substrate, whereby the first and second insulating materials are hardened.

Figure 6:
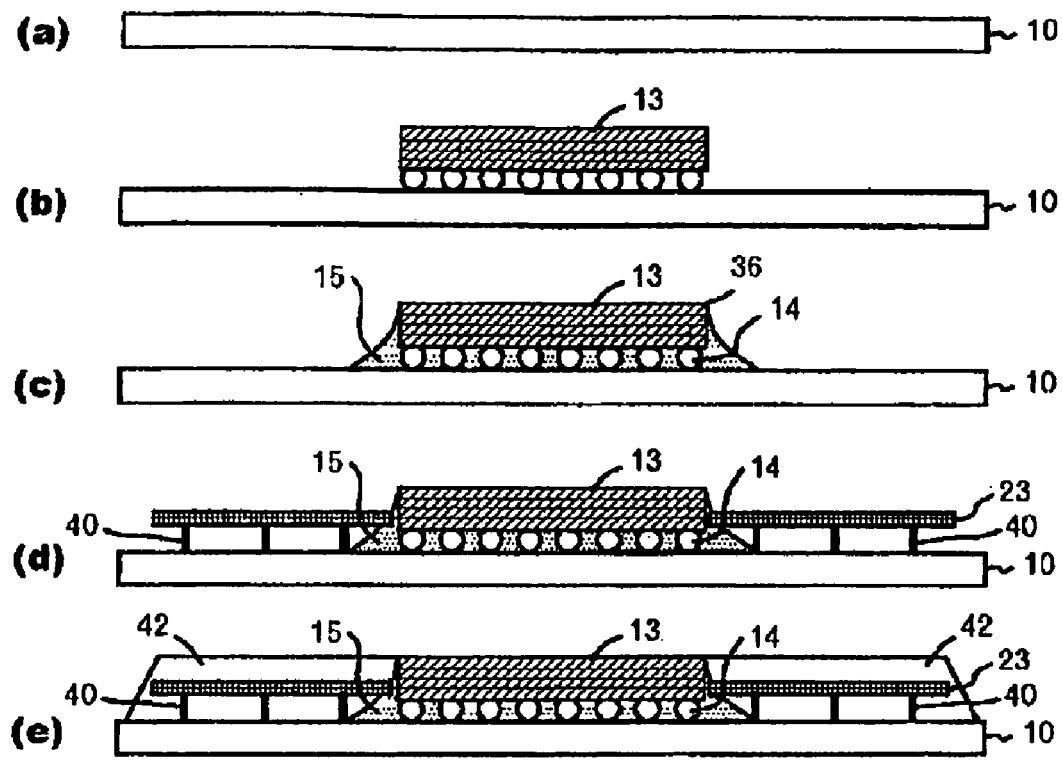
FIG. 6 is a view illustrating a manufacturing flow of a semiconductor package according to an embodiment of the present invention.

Another manufacturing method of the semiconductor package of the present invention will be described with reference to FIG. 6. The manufacturing method of FIG. 6 is characterized in that, instead of arranging the first insulating material layer 26 and second insulating material layer 28 of FIG. 4, an insulating layer covering the rigid plate 23 is arranged as a single layer by a single step. This manufacturing method takes advantage of the feature of the present invention that a rigid plate having a plurality of through holes is used.

Figure 4:
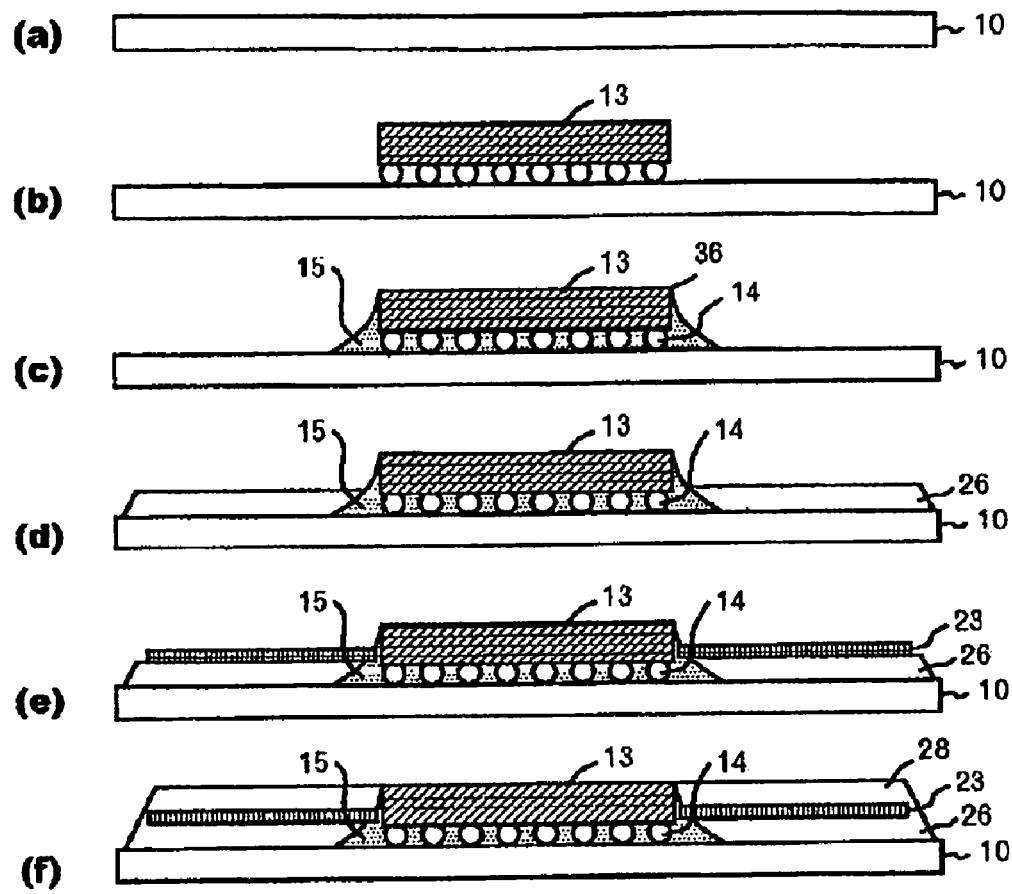
FIG. 4 is a view illustrating a manufacturing flow of the semiconductor package according to an embodiment of the present invention.

Steps (a) to (c) of FIG. 6 are similar to steps (a) to (c) of FIG. 4, and hence an explanation thereof is omitted here.

Figure 7:
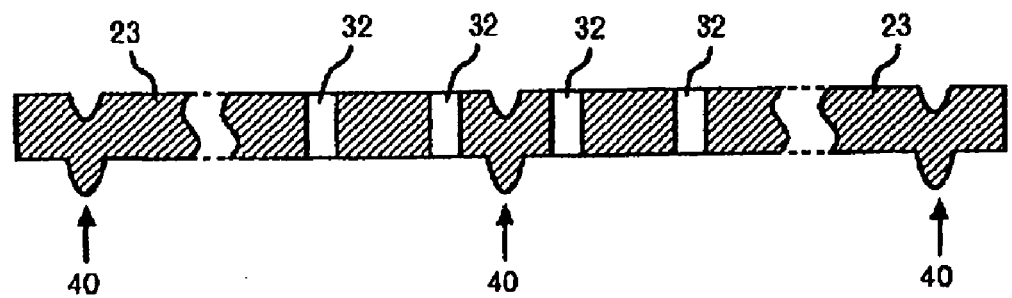
FIG. 7 is a partially enlarged cross-sectional view of the rigid plate.

In step (d), a rigid plate 23 is mounted on a surface of the substrate 10 so that a protrusion 40 used for positioning and mounting agrees with a positioning mark (not illustrated) preliminarily formed on the surface of the substrate 10. As many protrusions 40 as to allow the rigid plate 23 to be mounted stably on the surface of the substrate 10 is arranged in the rigid plate 23. FIG. 7 illustrates an enlarged view of the protrusions 40; FIG. 7 is a cross-sectional view of a part (half) of the rigid plate containing the protrusions 40. As with FIG. 5, the protrusions 40 are formed by pressing the metal between the through holes 32. In this case, the through holes 32 and protrusions 40 can be simultaneously formed. Here, the protrusion is not limited to the configuration illustrated in FIG. 7; any configuration can be used as long as a space can be ensured between the surface of the substrate 10 and the rigid plate 23.

In step (e), an insulating material layer 42 is arranged on the substrate 10 so as to cover the rigid plate 23. The insulating material 42 must be made of a material such as resin of a viscosity which is low to a certain degree. In step (e), the insulating material is applied via the periphery of the rigid plate 23 and the plurality of through holes 32 to the space between the surface of the substrate 10 and the rigid plate 23, and on a surface of the rigid plate 23. In step (e), the insulating material layer covering the rigid plate 23 can be arranged as a single layer by a single step. Consequently, the number of manufacturing steps can be reduced. Thereafter, the entire substrate is heated, or light is irradiated on the upper face of the substrate, whereby the insulating material 42 is hardened.

The present invention has been described by taking as an example, FIGS. 1 to 7. However, the present invention is not limited to these embodiments; those skilled in the art will recognize that many modifications to the embodiments described above are possible without departing from the gist of the invention. This application is intended to cover any adaptations or variations of the present invention. The following claims are in no way intended to limit the scope of the invention to the specific embodiments described herein.

What is claimed is:

1. A semiconductor package comprising:
   a substrate having a plurality of electrode pads on a surface thereof;
   a semiconductor chip mounted on the substrate, the semiconductor chip electrically connecting with the plurality of electrode pads; and
   a stiffener arranged on the substrate so as to surround the semiconductor chip,
   wherein the stiffener comprises:
   a layer comprising an insulating material; and
   a rigid plate having a central opening surrounding and adjacent the perimeter of the chip being mounted substantially parallel to the surface of the substrate in the insulating material layer such that the rigid plate is positioned between top and bottom surfaces of the chip, the rigid plate having formed therein a plurality of through holes, at least a part of the through holes being filled with the insulating material.

2. The semiconductor package according to claim 1, further comprising an underfill arranged between the surface of the substrate and the semiconductor chip.

3. The semiconductor package according to claim 1, wherein the rigid plate comprises a thermally conductive plate.

4. The semiconductor package according to claim 3, wherein the thermally conductive plate thermally connects with at least a part of a side face of the semiconductor chip.

5. The semiconductor package according to claim 1, wherein the rigid plate comprises a metal.

6. The semiconductor package according to claim 1, wherein the insulating material layer comprises a resin material.

7. The semiconductor package according to claim 1, wherein the plurality of through holes are arranged in a grid pattern on a surface of the rigid plate.

8. The semiconductor package according to claim 2, wherein the stiffener and the underfill are in contact with each other at the periphery of the semiconductor chip.

9. The semiconductor package according to claim 1, wherein the substrate comprises a coreless substrate.

10. The semiconductor package according to claim 1, wherein the substrate comprises a build-up wiring substrate.

11. The semiconductor package according to claim 1, wherein the semiconductor chip is joined to the plurality of electrode pads of the substrate by soldering.

12. A semiconductor device, wherein a semiconductor chip of claim 1 is joined by soldering to one printed circuit board at a surface in the rear side of a surface of the substrate on which a plurality of electrode pads reside.

* * * * *